United States Patent [19]
Malhi

[11] Patent Number: 5,619,463
[45] Date of Patent: Apr. 8, 1997

[54] INTEGRATED CIRCUIT DEVICE AND TEST METHOD THEREFOR

[75] Inventor: Vijay Malhi, Milan, Italy

[73] Assignee: SGS-Thomson Microelectronics Limited, Almondsbury Bristol, United Kingdom

[21] Appl. No.: 518,422

[22] Filed: Aug. 24, 1995

[30] Foreign Application Priority Data

Aug. 26, 1994 [GB] United Kingdom .................. 9417244

[51] Int. Cl.$^6$ .......................... G01R 31/28; G01R 15/12
[52] U.S. Cl. .................. 365/201; 365/189.02; 365/236; 365/233; 324/763; 324/765; 324/73.1
[58] Field of Search ................................ 365/233.5, 222, 365/201, 193, 236, 189.02, 233; 324/763, 765, 73.1; 395/800

[56] References Cited

U.S. PATENT DOCUMENTS 5,099,196  3/1992  Lingwell .................. 324/158 R
5,218,707  6/1993  Little et al. .................. 395/800
5,450,364  9/1995  Stephens, Jr. et al. .................. 365/222
5,457,400  10/1995  Ahmad et al. .................. 324/763

FOREIGN PATENT DOCUMENTS 2217465  10/1989  United Kingdom .......... G01R 31/28

OTHER PUBLICATIONS

Standard Search Report dated Nov. 21, 1994.

Primary Examiner—Viet Q. Nguyen
Attorney, Agent, or Firm—David M. Driscoll; James H. Morris

[57] ABSTRACT

An integrated circuit device includes an oscillator; a counter; a switch for selectively connecting the oscillator to the counter in a test mode; and an output circuit for providing the output count generated by the counter for determining the frequency of the oscillator. Thus, use is made of the normal on-chip counter in an integrated circuit to provide a reliable way of measuring the frequency of the on-chip oscillator.

27 Claims, 2 Drawing Sheets

INTEGRATED CIRCUIT DEVICE AND TEST METHOD THEREFOR

FIELD OF THE INVENTION

This invention relates to testing an integrated circuit device, and is particularly suitable for the testing of integrated circuit memory devices, for example flash memory devices.

BACKGROUND TO THE INVENTION

Many integrated circuit devices include an oscillator which provides a periodic output signal for normally controlling operation of the device. In some integrated circuit memory devices, the oscillator plays a role in which the frequency of the periodic output signal is not critical, provided that it remains broadly within predefined parameters. However, in integrated circuit flash memory devices, the oscillator plays a more critical role to control the programming and erase times of flash memory cells and also to control the other timing events relating to programming and transitions of states between different modes. Thus, in an integrated circuit flash memory device it is particularly important to be able to monitor and control the frequency of the periodic output signal of the oscillator. It will readily be appreciated that this frequency can vary for a plurality of different reasons, including in particular variations in process technology and the operating temperature of the integrated circuit device.

Conventional memory testers are not equipped to measure the frequency of a free running periodic signal. It will be appreciated that reference herein to an integrated circuit device generally implies a single chip device or a plurality of chips in a single package. To measure the frequency of a periodic output signal from an oscillator on chip, existing technology requires that the periodic signal be transmitted off chip to an external piece of equipment which includes for example an interval counter. An alternative method of measurement using existing technology is to provide a phase locked loop and frequency to voltage converter at the test interface with the chip to convert the frequency of the periodic output signal of the oscillator into a voltage which can then be measured by a conventional memory tester. In these situations, the integrity of the periodic signal must be guaranteed up to the point at which the measurement is taken. It will readily be appreciated that for a periodic signal, particularly one at a high frequency, this is not always easy to accomplish. Moreover, it will readily be understood that with existing technology specialized pieces of equipment in addition to a conventional memory tester are required to measure the frequency of the output signal of the oscillator.

In GB-A-2217465 (Sun Microsystems Inc.), a terminal count detector is used. Use is made of a count generated by the tester to be applied to the part. When the part detects that the count has reached a predefined limit fixed by design, it disables the oscillator and a reading of the clock input counter may be made from which a frequency is derived. Using the tester to produce a count in devices where the pin count is low only allows a small number of bits to be assigned to this test mode so reducing the resolution to which an interval time can be controlled.

IN US-A-5099196 (Long et al.), a comparator is used in a similar way to the terminal count detector of GB-A-2217465. Latches produced on the chip are loaded with what would represent the test limit of the frequency. The oscillator is then enabled and disabled, but the result of the counter is not available to be brought out to the tester. Instead, a comparator exists on chip which compares the value stored in the latches and the value of the oscillator counter. The result of this comparison produces a go-no go test for the frequency. Thus, this document does not give the value of the frequency in one test but instead a search has to be conducted to find the frequency. Furthermore, it adds extra complications to the circuitry which costs in terms of silicon area.

Thus, both of these prior art proposals involve adding extra devices to the chip to provide the necessary functionality for testing.

It is an object of the present invention to provide a simpler and more reliable way of measuring the frequency of a periodic signal output from an on-chip oscillator in an integrated circuit device.

SUMMARY OF THE INVENTION

According to one aspect of the present invention there is provided an integrated circuit device including: an oscillator arranged to produce a periodic output signal for normally controlling operations of the device; a counter having an input for normally receiving a periodic signal representing operations of the memory device and arranged to count transitions in said periodic signal to generate an output count; switch circuitry for selectively connecting said periodic output signal of the oscillator to the input of the counter in a test mode, said test mode being implemented for a predetermined time; and an output circuit for providing the output count generated by said counter after said predetermined time to a tester capable of deriving the frequency of the oscillator from said output count and said predetermined time.

Where the integrated circuit device is implemented on a single chip, the output circuit can comprise at least one output pin for transmitting the output count to a tester which is off-chip.

Measurement of the frequency of the periodic signal output from the oscillator can be used as a process monitor at electrical wafer sort. It is a significant advantage that the periodic signal itself does not have to come off-chip, but instead a logical signal representing the value of the frequency is transmitted with more relaxed timing requirements. The ability to test all of the chips at production enables fast feedback to be given to the manufacturing process if a problem arises.

In the described embodiment, the switch circuitry is connected to receive the periodic output signal from the oscillator and is operable to inhibit transmission of the periodic output signal to the counter in normal use and to allow transmission of the periodic output signal to the counter in the test mode. This enables the periodic output signal from the oscillator to be used to control operations of the device even during a test mode. However, it would equally be possible to implement the switch circuitry so that it connects the periodic output signal of the oscillator either to circuitry for normally controlling operations of the device in normal use or to the counter in the test mode.

The integrated circuit device can include a test bus and a test multiplexor operable to connect the output of the counter onto the test bus in the test mode. Likewise, the output circuit can be connected to the test bus in the test mode via an output multiplexor.

The output count generated by the counter after the predetermined time can be stored at the counter or elsewhere so that it is available in response to control address signals. If the output count generated by the counter is in the form of a plurality of bits having a number greater than the capacity of the test bus, the integrated circuit device can include circuitry for transmitting the output count to the tester over a plurality of address cycles.

The present invention is particularly but not exclusively applicable to integrated circuit memory devices, and particularly flash memory devices. Where the integrated circuit device includes a memory, the frequency value of the oscillator derived from the tester can be stored at addressable locations within the memory. Where the memory device is a flash memory, the frequency can be stored in OTP (one time programmable) cells in the flash memory device like other commonly stored electrical parameters characterizing the device. This provides a valuable indication of the state of the process used to produce the integrated circuit device if it is returned suffering from problems. It also assists in addressing reliability problems, for example if the behavior of the device changes with different operations as can be the case with contamination. To establish this, the device could be tested again in the manner outlined above and a comparison of the actual frequency measured with the stored frequency would indicate this problem.

Storage of the frequency value also allows the thermal coefficient of the chip or of the package to be ascertained, since the frequency of the periodic signal output from the oscillator is dependent on temperature. Knowledge of the initial temperature, together with the frequency stored in the memory provides a known coefficient reference.

The invention also provides a method of characterizing an integrated circuit device comprising the steps of: enabling an oscillator provided within the integrated circuit device for normally controlling operations of the device for a predetermined time so that the oscillator produces a periodic output signal for said predetermined time; connecting said periodic output signal to the input of a counter which is provided within said integrated circuit device for representing operations of the device in normal use, said counter being arranged to count transitions in said periodic signal to generate an output count; and supplying said output count to a tester capable to deriving the frequency of the oscillator from said output count and said predetermined time.

Thus, because the oscillator is enabled for any time controlled by the tester, a relatively cheap tester can control this very accurately. This allows the time over which the measurements are made to be controlled more precisely. In particular, it avoid the need for a terminal count detector of the type described in GB-A-2217465. Moreover, in the preferred embodiments the invention makes use of components which are normally available in an integrated circuit device for normal operations of the part, and therefore does not add overhead in terms of silicon area.

For a better understanding of the present invention and to show how the same may be carried into effect reference will now be made by way of example to the accompanying drawings.

DESCRIPTION OF THE PREFERRED EMBODIMENTS

Figure 1:
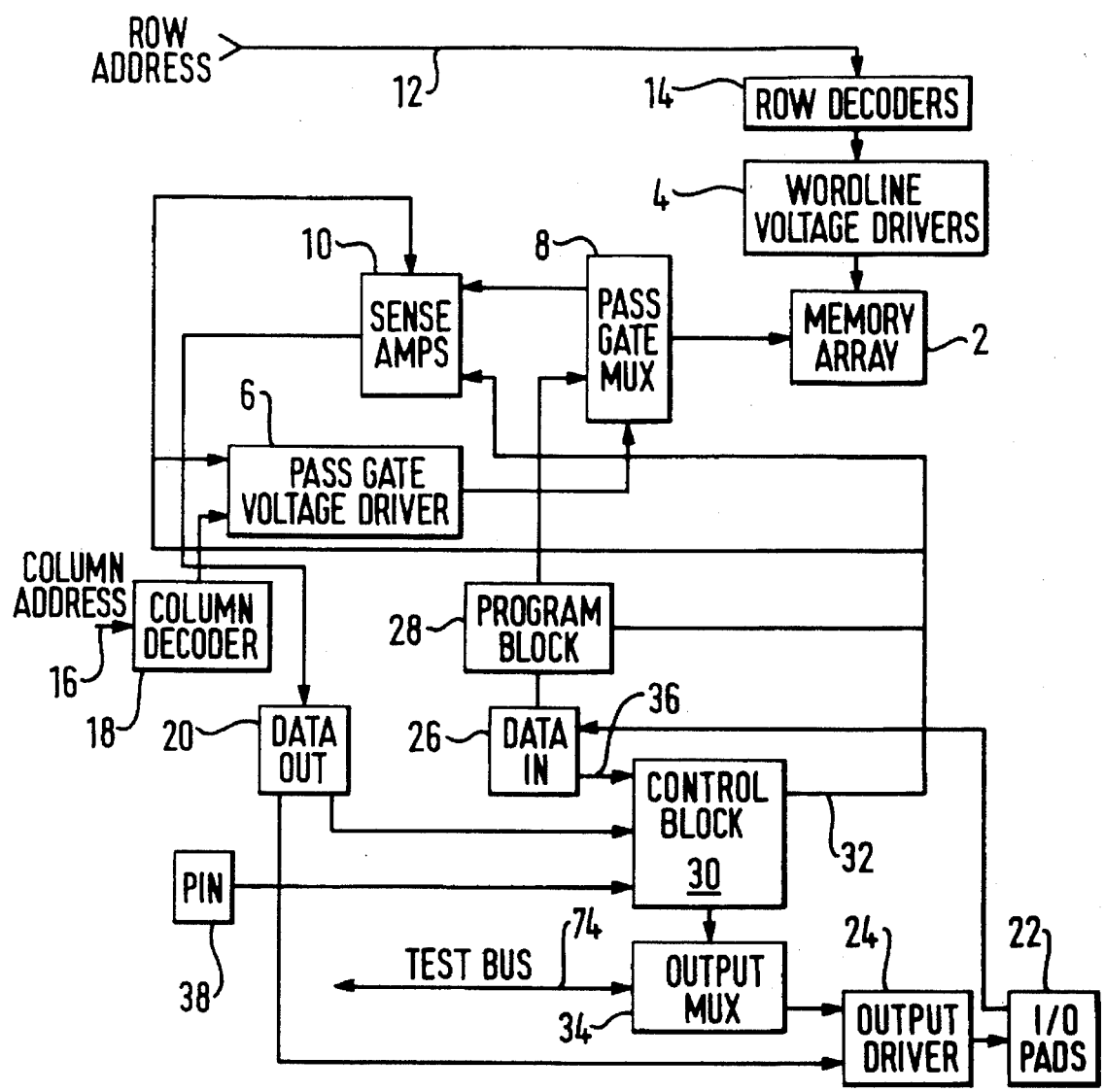
FIG. 1 is a block diagram of a flash memory device.

By way of background, the main components of a flash memory device will now be described with reference to FIG. 1. Reference numeral 2 denotes a memory array which comprises a plurality of flash memory cells each of which can be programmed, erased and read in a known fashion. The memory array 2 also includes some OTP (one time programmable) cells for holding permanent data. The memory array 2 is controlled by wordline voltage drivers 4 and pass gate voltage drivers 6. A pass gate multiplexor 8 allows bit lines of the memory array to be connected either to the pass gate voltage drivers 6 for programming the memory array or to sense amplifiers 10 for reading from the memory array. A row address is fed on line 12 to a row decoder 14 which controls the wordline voltage drivers 4. Likewise, a column address is fed on line 16 to a column decoder 18 which controls the pass gate voltage drivers 6. Data read from the memory array 2 via the sense amplifiers 10 is passed via a data out circuit 20 and an output driver circuit 24 to input/output pads 22. Data to be programmed into the memory array 2 is supplied from the input/output pads 22 via a data in circuit 26 and a program block 28 to control the pass gate multiplexor 8 to allow data to be programmed into the memory array 2. A control block 30 controls operations of the integrated circuit device via output signals on line 32. These signals include a periodic signal or clock which controls the timing of events in the device, including programming, erasing and reading. The control block 30 is also connected via an output multiplexor 34 and the output driver circuit 24 onto the input/output pads 22.

The details of programming, erasing and reading are not given herein because they are well within the scope of a person skilled in the art. Moreover, some of the circuitry required to implement programming, reading and erasing is not shown in FIG. 1 because, likewise, this would be well known to a person skilled in the art. The invention resides in the elements of the control block 30 and the manner in which it is used to test the device. This will now be described more fully with reference to FIG. 2.

Operations of the control block 30 can be controlled either by data input to the chip via the data in circuit 26 and transmitted to the control block 30 on line 36 or by signals applied to pins (e.g. chip enable, write enable and address pins) of the chip, for example as illustrated by pin 38 in FIG. 1.

Figure 2:
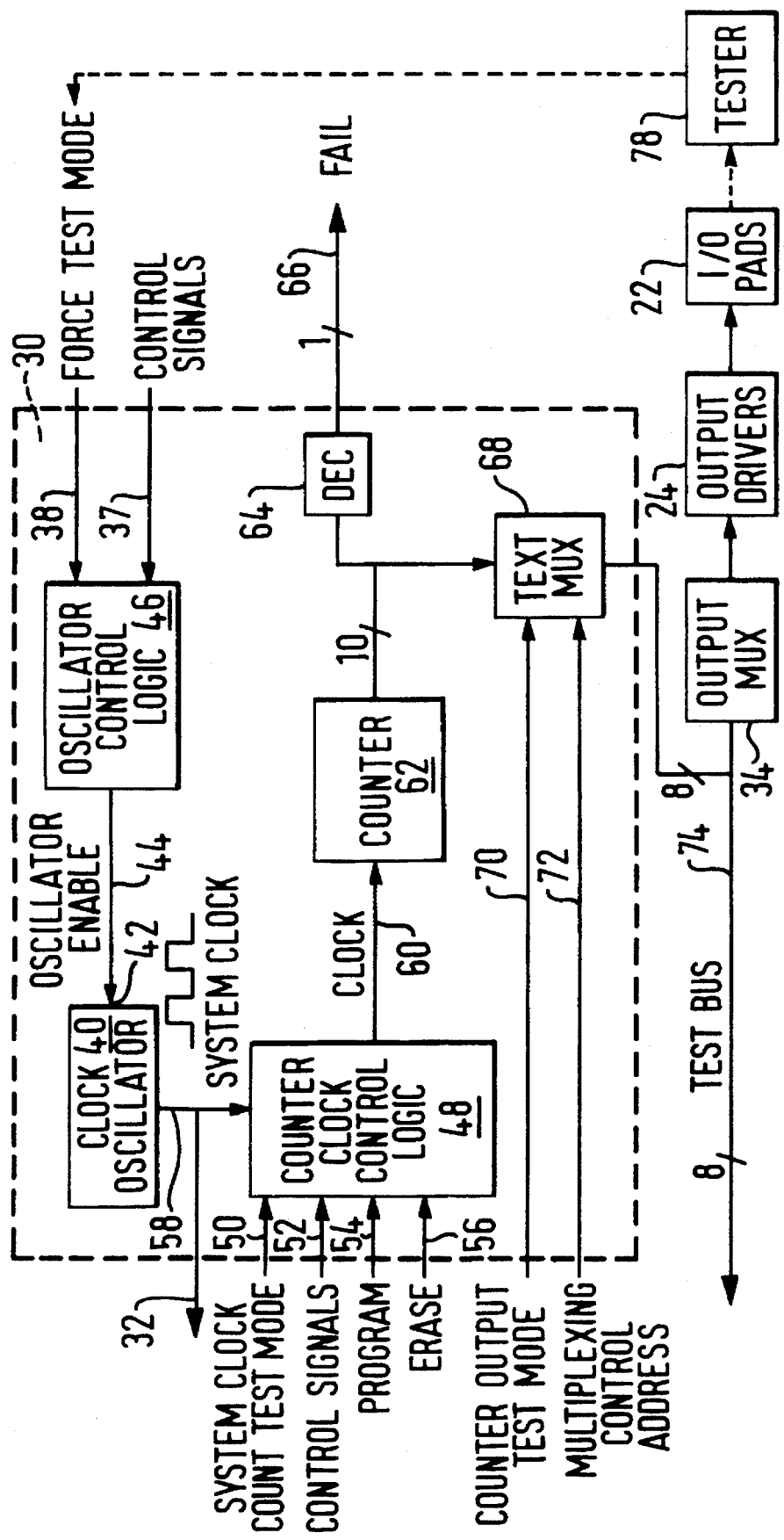
FIG. 2 is a diagram of control circuitry for the device illustrating the present invention.

As illustrated in FIG. 2, the control block 30 includes an oscillator 40 having an enable input 42 which is controlled on an oscillator enable line 44 from oscillator control logic 46. The oscillator control logic 46 receives a forced test mode signal from a pin of the chip which is denoted as 38 in correspondence with the pin illustrated in FIG. 1, although it will be appreciated that any appropriate pin could be used. The oscillator control logic 46 also receives control signals from the data in circuit on line 37. The control block 30 further comprises counter clock control logic 48 which receives the following signals:

A system clock count test mode signal on line 50.
General control signals on line 52.
Program control signal on line 54.
Erase control signal on line 56.
Periodic output signal from the oscillator on line 58 and denoted system clock in FIG. 2.

The counter clock control logic 48 is connected via an output line 60 to a counter 62. This counter is generally present in a conventional integrated circuit flash memory device for alerting a failure mode of the device. It can also be used for other purposes in normal operation. Likewise, the output signal from the oscillator is used to normally control operations of the device in normal use on output line 32.

The counter 62 has a 10 bit output indicating the output count. This is supplied to a decoder 64 which can alert a failure mode on line 66. The output count is also supplied to a test multiplexor 68 which is connected to the output multiplexor 34.

The test multiplexor 68 is controlled by a failure counter output test mode signal on line 70 and receives multiplexing control addresses on line 72. The test multiplexor 68 provides an 8 bit output onto an 8 bit test bus 74 which is a bidirectional bus connected to the output multiplexor 34.

Use of the control block will now be described to measure the frequency of the system clock 58 produced by the oscillator 42 in a special test mode. The signal FORCE TEST MODE from pin 38 signals the oscillator control logic 46 to enable or disable the oscillator via the oscillator enable input 42 according to the state of the signal. The counter clock control logic 48 controls whether or not the system clock 58 passes to the counter 62 on line 60 so that it can increment the counter. The counter clock control logic is controlled to connect the system clock 58 to the counter 62 responsive to the SYSTEM CLOCK COUNT TEST MODE signal on line 50.

In normal use, the output of the counter is decoded to produce delays which are used by other sections of the circuitry, for example represented in FIG. 2 by the decoder 64 to signal a failure mode. For the purposes of the present invention, the output of the counter 62 can be connected to the test bus 74 via the test multiplexor 68 under the control of the COUNTER OUTPUT TEST MODE signal on line 70. The output count can in this way be supplied off-chip through the output multiplexor 34 and output drivers 24 through the input/output pads 22. An external tester 78 receives the output count and supplies the FORCE TEST MODE signal. The tester 78 can also supply the signals for the counter clock control logic on lines 50 to 56 and for the test multiplexor 68 on lines 70 and 72, although for the sake of clarity these connections are not shown in FIG. 2. Alternatively, the signals on lines 50 to 56 and 70 to 72 could be supplied by additional circuitry within the control block 30 which is not described herein because it does not form part of this invention.

The special test mode can be entered in any known fashion, for example by external signals applied to pin 38 and to a pin connected to line 50 or by latching test mode codes via the data in circuit 26 onto control lines 36. The manner in which the test mode is entered is not important to the invention and it is well within the scope of a skilled person to provide a way of entering the test mode.

In the test mode, the oscillator 40 is enabled for a predetermined time which is determined by the tester 78. During this time, the system clock 58 is supplied to the counter 62 via the counter clock control logic 48 on line 60 to increment the counter. At the end of the predetermined time, the output of the counter is read from the device by controlling the test multiplexor 68 to place the output count onto the test bus 74 from where it can be supplied off-chip by the input/output pads 22 to the tester 78. This is done by setting the counter output test mode signal 70 and multiplexing control address line 72. Some oscillators take a while after start-up to reach their operating frequency. In such cases, the oscillator can be enabled without connecting its output to the counter until some time later under the control of the SYSTEM CLOCK COUNT TEST MODE signal on line 50.

Where the output count has a number of bits (in this example 10) which is greater than the bit capacity of the test bus (in this example 8), the output count is supplied onto the test bus in a plurality of cycles under the control of the multiplexing control addresses on line 72.

The frequency of the system clock 58 can then be determined by the value of the output count supplied to the tester 78 and the predetermined time for which the oscillator was enabled, also determined by the tester 78. If desired, this frequency value can be written into the memory array 2 into UPROM or other appropriate permanent cells. This would be done by programming the memory array in a known fashion.

In the preferred embodiment, a linear feedback shift register counter is used because this uses only a small amount of silicon area. However, it will readily be appreciated that any counter may be used with the present invention.

By making use of components, namely the oscillator and the counter, which are already on the integrated circuit device for normal operation, the amount of silicon area which is required to provide circuitry for implementing the test is kept to a minimum. Moreover, the test mode enables a valuable item of information, namely the frequency of the system clock, to be monitored and controlled in a very simple fashion. This means that this value can be determined for each chip and at several times during the life of the chip. This is not possible with existing technology because of the need to take the system clock off-chip in order to evaluate its frequency.

What is claimed is:

1. An integrated circuit device, operable in a normal mode and a test mode, the device being testable in association with a tester, including:

an oscillator arranged to produce a periodic output signal for controlling operations of the device, during the normal mode of operation;

a counter having an input for receiving a timing signal representing operations of the device, during the normal mode of operation, and arranged to count transitions in said periodic output signal to generate an output count during the test mode of operation;

switch circuitry for selectively connecting said periodic output signal of the oscillator to the input of the counter in the test mode of operation, said test mode being implemented for a predetermined time; and an output circuit for providing the output count generated by said counter after said predetermined time to the tester so that the tester can derive the frequency of the oscillator from said output count and said predetermined time.

2. An integrated circuit device according to claim 1 which is implemented on a single chip and wherein the output circuit comprises at least one output pin for transmitting said output count to a tester which is off-chip.

3. An integrated circuit device according to claim 1 or 2 wherein the switch circuitry is connected to received said periodic output signal from the oscillator and is operable to inhibit transmission of said periodic output signal to said counter, during the normal mode of operation, and to allow transmission of said periodic output signal to said counter in the test mode of operation.

4. An integrated circuit device according to claim 1 or 2 wherein the switch circuitry is operable to connect said periodic output signal of the oscillator either to a circuit for controlling operations of the device during the normal mode of operation or to said counter during the test mode of operation.

5. An integrated circuit device according to claim 1 wherein the oscillator has an enable input which is enabled for said predetermined time by selection of said test mode.

6. An integrated circuit device according to claim 1 which comprises a test bus and a test multiplexor operable to connect the output of said counter onto the test bus during said test mode of operation.

7. An integrated circuit device according to claim 6 wherein said output circuit is connected to the test bus, during said test mode of operation, via an output multiplexor.

8. An integrated circuit device according to claim 1 wherein the output count generated by the counter after said predetermined time is stored and is available in response to control address signals.

9. An integrated circuit device according to claim 8 wherein the output count generated by the counter is in the form of a plurality of bits wherein the number of bits is greater than the capacity of the test bus, said integrated circuit device further comprising circuitry for transmitting said output count to said tester over a plurality of address cycles.

10. An integrated circuit device according to claim 8 or 9 which comprises an address pin via which said control address signals are supplied.

11. An integrated circuit device according to claim 1 wherein said switch circuitry is connected to receive a test mode implementation signal from an address pin of the integrated circuit device.

12. An integrated circuit device according to claim 1 which includes a memory having addressable locations, and wherein the frequency of the oscillator derived from said tester is stored at said addressable locations within said memory.

13. A memory device, operable in a normal mode and a test mode, the device being testable in association with a tester, including:
  an array of memory cells;
  decode circuitry to selectively access memory cells in said array;
  an oscillator arranged to produce a periodic output signal for controlling operations of the memory device during the normal mode of operation;
  a counter having an input for receiving a timing signal representing operations of the memory device, during the normal mode of operation, and arranged to count transitions in said periodic output signal to generate an output count during the test mode of operation;
  switch circuitry for selectively connecting said periodic output signal of the oscillator to the input of the counter during the test mode of operation, said test mode being implemented for a predetermined time; and
  an output circuit for providing the output count generated by said counter after said predetermined time to the tester so that the tester can derive the frequency of the oscillator from said output count and said predetermined time.

14. A method of characterizing an integrated circuit device comprising the steps of:
  enabling an oscillator, provided within the integrated circuit device for controlling operations during a normal mode of operation of the device, for a predetermined time during a test mode of operation so that the oscillator produces a periodic output signal for said predetermined time;
  connecting said periodic output signal to the input of a counter, which is provided within said integrated circuit device for representing operations of the device in the normal mode of operation, said counter being arranged to count transitions in said periodic output signal to generate an output count during the test mode of operation; and
  supplying said output count to a tester capable of deriving the frequency of the oscillator from said output count and said predetermined time.

15. A test method according to claim 14 wherein the integrated circuit device is implemented on a single chip and wherein said tester is off-chip.

16. A test method according to claim 14 or 15 when used to test an integrated circuit device comprising a test bus and a test multiplexor, said method further comprising a step of connecting the output of said counter onto said test bus via said test multiplexor to supply said output count to the tester.

17. A test method according to claim 14 wherein the output count generated by the counter after said predetermined time is stored and is available in response to control address signals.

18. A test method according to claim 17 wherein said output count is supplied as a plurality of bits wherein the number of bits is greater than the capacity of the test bust and wherein said output count is transmitted to said tester over a plurality of address cycles.

19. A test method according to claim 17 or 18 wherein said control address signals are supplied via an address pin of the integrated circuit device.

20. A test method according to claim 14 wherein a test mode is implemented by application of a signal to an address pin of the integrated circuit device.

21. A test method according to claims 14 wherein the device includes a memory having addressable locations, and the frequency of the oscillator derived by the tester is stored at the addressable locations within the memory.

22. An integrated circuit device, operable in a normal mode and a test mode, the device being testable in association with a tester, including:
  an oscillator arranged to produce a periodic output signal to control operations of the device during the normal mode of operation;
  a counter having an input for receiving, during the normal mode of operation, a timing signal representing operations of the device, and arranged to count transitions in said periodic output signal to generate an output count during the test mode of operation;
  switch circuitry for selectively connecting said periodic output signal of the oscillator to the input of the counter in the test mode of operation, said test mode being implemented for a predetermined time; and
  an output circuit for providing the output count generated by said counter after said predetermined time to the tester; and
  wherein the device is implemented on a single chip and the output circuit comprises at least one output pin for transmitting said output count to the tester which is off-chip.

23. A method of testing an integrated circuit device comprising the steps of:
  enabling an oscillator, provided within the integrated circuit device for controlling operations during a normal mode of operation of the device, for a predetermined time during a test mode of operation so that the oscillator produces a periodic output signal for said predetermined time;
  connecting said periodic output signal to the input of a counter, which is provided within said integrated circuit device for counting operations of the device in the normal mode of operation, said counter being arranged to count transitions in said periodic signal to generate an output count during the test mode of operation; and supplying said output count to a tester capable of deriving the frequency of the oscillator from said output count and said predetermined time; and wherein the integrated circuit device is implemented on a single chip and said tester is off-chip.

24. A method of testing an integrated circuit device, comprising steps of:

(A) counting a number of pulses on a periodic signal generated on the device;

(B) providing at least one test signal to the device from an external tester to enable the counting in step (A), the duration of the counting being determined by the at least one test signal;

(C) providing the counted number to the external tester; and (D) calculating a frequency of the periodic signal in the external tester.

25. The method of claim 24, wherein the step (A) comprises a step of:

counting the number of pulses on an oscillator provided on the integrated circuit device for use during a normal mode of operation.

26. A method of testing an integrated circuit device, the method comprising steps of:

(A) counting a number of oscillations of an oscillating signal provided by an oscillating circuit, the oscillating signal being used by and for the operation of the integrated circuit device in a normal mode of operation, the counting occuring over a period of time; and (B) calculating a frequency of the oscillating circuit based on the number of oscillations counted and the length of the period of time.

27. The method of claim 26, wherein:

the step (A) comprises a step of counting the number of oscillations of the oscillating signal during a test mode of operation for the period of time, the period of time being controlled by an external tester; and the step (B) is performed by the external tester.

* * * * *